United States Patent [19]
Paoli

[11] Patent Number: 5,323,026
[45] Date of Patent: Jun. 21, 1994

[54] SEMICONDUCTOR LASER WITH INTEGRATED PHOTOTRANSISTOR FOR DYNAMIC POWER STABILIZATION

[75] Inventor: Thomas L. Paoli, Los Altos, Calif.

[73] Assignee: Xerox Corporation, Stamford, Conn.

[21] Appl. No.: 924,204

[22] Filed: Aug. 3, 1992

[51] Int. Cl.$^5$ .......................................... H01L 31/12
[52] U.S. Cl. .................................... 257/85; 257/197; 257/83; 372/45; 372/50
[58] Field of Search ...................... 257/13, 83, 84, 85, 257/94, 98; 372/45, 46, 50

[56] References Cited

U.S. PATENT DOCUMENTS

| | | | |
|---|---|---|---|
| 4,639,275 | 1/1987 | Holonyak, Jr. | 148/1.5 |
| 4,674,100 | 6/1987 | Kobayashi | 372/96 |
| 4,801,993 | 1/1989 | Ankri et al. | 372/50 |
| 4,802,182 | 1/1989 | Thornton et al. | 372/50 |
| 4,956,682 | 9/1990 | Ohnaka et al. | 372/50 |
| 4,987,468 | 1/1991 | Thornton | 357/34 |
| 5,003,359 | 3/1991 | Abeles | 372/50 |
| 5,038,185 | 8/1991 | Thornton | 372/46 |
| 5,136,604 | 8/1992 | Paoli et al. | 372/50 |
| 5,181,085 | 1/1993 | Moon et al. | 257/94 |

FOREIGN PATENT DOCUMENTS 1-20690  1/1989  Japan ................................ 257/84

OTHER PUBLICATIONS

Thornton, R. L.; Mosby, W. J.; Chung, H. F. *Unified Planar Process for Fabricating Heterojunction Bipolar Transistors and Buried-Heterostructure Lasers Utilizing Impurity-Induced Disordering.* Applied Physics Letters, vol. 53, No. 26, pp. 2669–2671, Dec. 26, 1988.

Campbell, J. C. *Phototransistors for Lightwave Communications.* Semiconductors and Semimetals, vol. 22, part D, edited by W. T. Tsang, pp. 389–447, Academic Press, (1985).

Merz, J. L.; Logan, R. A. *Integrated GaAs-$Al_xGa_{1-x}$As Injection Lasers and Detectors with Etched Reflectors.* Applied Physics Letters, vol. 30, No. 10, pp. 530–533, May 15, 1977.

Iga, K.; Miller, B. I. *GainAsP/InP Laser with Monolithically Integrated Monitoring Detector.* Electronics Letter, vol. 16, pp. 342–343, Mar. 27, 1980.

Katz, J.; Bar-Chaim, N.; Chen, P. C.; Margalit, S.; Ury, I.; Wilt, D.; Yust, M.; Yariv, A. *A Monolithic Integration of GaAs/GaAlAs Bipolar Transistor and Heterostructure Laser.* Applied Physics Letters, vol. 37, No. 2, pp. 211–213, Jul. 15, 1980.

Bona, G. L.; Buchmann, P.; Clauberg, R.; Jaeckel, H.; Vettiger, P.; Voegeli, O.; Webb, D. J. *Beam Properties of AlGaAs Power Lasers with High-Quality Etched Mirrors.* IEEE Phontonics Technology Letters, vol. 3, No. 5, pp. 412–413, May 1991.

*Primary Examiner*—Rolf Hille
*Assistant Examiner*—Minhloan Tran
*Attorney, Agent, or Firm*—John M. Kelly; Jonathan A. Small

[57] ABSTRACT

A diode laser of the buried heterostructure type with transverse injection and a lateral bipolar transistor structure are monolithically and coaxially formed in the same set of semiconductor layers to make an integral laser device that emits a constant level of optical power stabilized against unpredictable variations. The base region of the transistor structure is formed coaxially with the laser waveguide, so that laser power passes into or through the transistor base. Electrical feedback is provided from the transistor to the laser via a resistor between the collector of the transistor and the anode of the laser, thereby controlling the current delivered by an external current source to the laser.

13 Claims, 8 Drawing Sheets

SEMICONDUCTOR LASER WITH INTEGRATED PHOTOTRANSISTOR FOR DYNAMIC POWER STABILIZATION

BACKGROUND OF THE INVENTION

The present invention relates generally to the field of semiconductor lasers, and more specifically to a semiconductor laser coaxially integrated with a phototransistor.

Semiconductor lasers, also referred to as diode lasers, are well known in the art. These devices generally consist of a planar layered semiconductor structure having one or more active layers bounded at their ends by cleaved surfaces that act as mirrors for the optical resonator. In one form of this structure the layers on one side of the active layer or layers are doped with impurities so as to have an excess of mobile electrons, while on the other side of the active layer(s) the semiconductor layers are doped with impurities so as to have a deficiency of mobile electrons, therefore creating an excess of positively charged carriers called holes. Layers with excess electrons are said to be n-type, i.e. negative, while layers with excess holes are said to be p-type, i.e. positive. Activation of the laser is achieved by applying an electrical potential between the p-side and the n-side of the layered structure, thereby driving either holes or electrons or both in a direction perpendicular to the planar layers so as to "inject" them into the active layers, where electrons recombine with holes to produce light. Optical feedback provided by the cleaved mirrors allows resonance of some of the emitted light to produce coherent "lasing".

In another form of diode laser, one region of the active layer or layers in the plane of the active layer is made to be p-type while another region in the plane of the active layer is made to be n-type. A p-n junction is thereby formed in the active layer or layers, so as to drive electrons or holes in a direction parallel to the plane of the active layers. A p-type optical waveguide for the lasing action can be formed by placing n-type regions on either side of the p-type region, thereby forming an n-p-n laser structure, as described by Thornton, et al., in *Unified Planar process for Fabricating Heterojunction Bipolar Transistors and Buried-Heterostructure Lasers Utilizing Impurity-Induced Disordering*, Applied Physics Letters, vol. 53, no 26, pp. 2669-2671, (1988). Activation of the p-type waveguide is achieved by applying an electrical potential between the p-side and n-side of both junctions, thereby injecting electrons into the p-type region, where they recombine with holes to produce light. Similarly an n-type optical waveguide for the lasing action can be formed in an n-type active layer or layers, by placing p-type regions on either side of the n-type region, thereby forming a p-n-p laser structure. Activation of the n-type waveguide is achieved by applying an electrical potential between the p-side and n-side of both junctions thereby injecting holes into the n-type region, where they recombine with electrons to produce light. Both of these structures are known as transverse junction lasers because the p-n junction lies across, i.e. transverse to, the active layers.

The transverse n-p-n or p-n-p laser structure described above also functions as a bipolar transistor as disclosed in detail in U.S. Pat. No. 4,987,468, dated Jan. 22, 1991, to Thornton. For example, FIG. 1 shows the n-p-n structure fabricated by impurity-induced layer disordering on a semi-insulating substrate with the base, emitter, and collector contacts for the transistor all placed on the top surface of the semiconductor layers. Since the base region is necessarily kept very narrow, on the order of a few microns in width, the base contact is placed remote from the active base region with a conductive path allowed around and under one of the n-type regions. As with other transistor structures, the bipolar n-p-n device is operated in common-emitter mode by applying a positive voltage between the p-type base and the n-type emitter, thereby forward-biasing the base/emitter junction, and a positive voltage between the n-type collector and the n-type emitter, thereby reverse-biasing the collector base junction.

It is well known in the art that a transistor structure can be used as an optical detector with gain by introducing the incident light into the base region. See, e.g. J. C. Campbell, *Phototransistors for Lightwave Communications*, in Semiconductors and Semimetals, vol. 22, part D, edited by W. T. Tsang, pp. 389-447, Academic Press, (1985). In the phototransistor, excess electron-hole pairs are created in the base by absorption of the input light. The electrons diffuse to and are collected by the reverse-biased collector junction, leaving excess holes in the p-type base that lower the forward-biased potential on the emitter junction, causing electrons to be injected to the base from the emitter. Because of the exponential dependence of current on junction potential in a forward-biased junction, more electrons are injected into the base than the holes created by the incident light, resulting in a current gain. Thus the current proportional to the incident light power generated in the base is amplified by normal transistor action.

Optical detectors monolithically integrated with diode lasers have been of considerable interest to those skilled in the art, as a way to monitor the level of power emitted by a diode laser, especially for monolithic arrays of independently addressed lasers. One approach, described by Merz, et al., in *Integrated GaAs-$Al_xGa_{1-x}As$ Injection Lasers and Detectors with Etched Reflectors*, Applied Physics Letters vol. 30, No. 10, pp. 530-533, (1977), employs a detector region containing the same layer configuration as the laser, located outside the laser resonator but coaxial with the direction of lasing and coupled to the laser by an underlying passive waveguide layer. A second approach, described by Iga, et al., in *GaInAsP/InP Laser with Monolithically Integrated Monitoring Detector*, Electronics Letters vol 16, pp. 342-343, (1980), employs a detector region containing the same layer configuration as the laser, separated from the laser by an etched groove. Both of these approaches employ in-line detectors which are outside the laser cavity and require at least one laser facet to be etched. Other novel methods and apparatus employing in-line detectors are disclosed in U.S. Pat. No. 5,136,604 assigned to the assignee hereof. In addition to in-line detection techniques, Kobayashi, in U.S. Pat. No. 4,674,100, dated Jun. 16, 1987, has disclosed the use of a diffraction grating within the laser cavity to deflect light in a direction normal to the plane of the active layer of the laser and into an integrated detector. Other methods and apparatus for deflecting light out of a laser cavity into a detector region are disclosed in the aforementioned U.S. Pat. No. 5,136,604.

One important application for a photodector integrated with a diode laser is in a feedback loop that stabilizes the power emitted by the laser against unpredictable variations. Thermal fluctuations are especially deleterious to maintaining constant optical power output, especially during pulsed modulation. For example, heating of the laser chip unavoidably occurs when the applied laser current is abruptly increased at the beginning of a pulse. Since a laser's output power is temperature dependent, this time-dependent, or transient, heating normally causes the power output to decrease or "droop" during the pulse. Furthermore, transient heating during a sequence of pulses can have a cumulative effect on the temperature that depends on the number and frequency of the pulses. For example, if the time between successive pulses is large, the device will be given sufficient time to cool, so that the application of the driving current has a large temperature effect, i.e. droop, during the next pulse. The shorter the time between pulses, the less time the device has a cool between one pulse and the next, leading to a sustained increase in the temperature of the laser. This sustained temperature increase results in a further decrease in amplitude of the output pulse obtained with a constant level of input current.

There is presently a need in the art for apparatus and methods which provide accurate and reproducible control of the optical energy contained in each pulse of an intensity-modulated light beam. For example, as described in concurrently filed U.S. patent application Ser. No. 07/906,145 and incorporated herein by reference thereto, digital printing on a photosensitive recording medium requires accurate control of the optical energy delivered in each pulse. In systems currently known to those skilled in the art, a predetermined amount of energy is delivered in each pulse by turning on the optical beam to a desired power level for a fixed time interval. This approach requires that the laser output power be reproducible from pulse to pulse and constant during a pulse, in order that the optical energy delivered in each pulse be accurately controlled. Accurate control is especially important in printing with different grey levels formed by varying the number of exposed spots or when exposing very closely spaced spots in order to control the formation of an edge. Power fluctuations can arise from many sources, including for example ambient thermal fluctuations, laser self-heating, laser degradation, fluctuations in the drive current, and/or the pattern of modulation. Since these fluctuations occur within each pulse and are very difficult to predict, control, or eliminate, they are commonly not compensated for. Thus there is presently a need in the art for apparatus and methods which provide accurate and reproducible control of the level of pulsed optical power emitted by an intensity-modulated diode laser.

Each of the integrated detectors of the prior art discussed above is formed by a simple p-n junction diode. A p-n junction diode of this type provides an electrical signal proportional to the laser power but does not provide amplification of the photo-generated current. Consequently such a detector requires an additional stage of amplification to produce feedback control sufficient to maintain constant laser output in the presence of unpredictable variations in laser temperature, drive current, or modulation pattern. Additional amplification can be obtained from an off chip circuit or by monolithically incorporating a remote transistor on the chip, e.g. as described by Katz, et. al., in a *Monolithic Integration of GaAs/GaAlAs Bipolar Transistor and Heterostructure Laser*, Applied Physics Letters vol. 37, pp. 211-213 (1980). However, instantaneous stabilization of the laser's output power requires high-speed electrical coupling from the detector to the transistor to the laser. Consequently, external circuitry is adequate to compensate slow variations of power but not for instantaneous stabilization during short pulse modulation such as encountered in laser printing systems. Similarly, with on-chip amplification, the required response times dictate that the transistor amplifier be physically located close to the laser/detector structure. Consequently, remote amplifying transistors are not suitable for use with more than two closely spaced lasers on a chip because the transistors must be placed too far from the laser/detector structure to allow adequately fast response. Accordingly, there is presently a need in the art for a compact monolithic apparatus emitting constant optical power either continuously or from pulse to pulse. These and other problems are addressed by various aspects of the present invention, which will be summarized and then described in detail below.

SUMMARY OF THE INVENTION

According to the present invention, a diode laser of the buried heterostructure type with transverse injection and a lateral bipolar transistor structure are monolithically and coaxially formed to make an integral laser device that emits a constant level of optical power stabilized against unpredictable variations. The integrated structure may be formed with a two-dimensional optical waveguide that is coaxially divided into first and second sections. Both sections comprise emitter, base, and collector regions, formed in the same set of semiconductor layers. One section functions as a transistor structure while the other functions as a laser structure. The base region of the transistor structure is formed coaxially with the laser waveguide, so that laser power passes into or through the transistor base. The collector of the transistor is connected via a resistor to the anode of the laser in order to form a feedback path for the transistor current to control the current delivered by a separate current source to the laser. The bias conditions and circuit parameters are chosen such that the laser emits the desired light power when pulsed on with a current pulse of appropriate magnitude. If the power output of the laser changes during the pulse, feedback from the transistor adjusts the current delivered to the laser to maintain the light output constant. For example, if the power output decreases from its set value, the collector current in the transistor decreases, thereby allowing the laser current to increase and return the output power to its set value. On the other hand, if the power output increases from its set value, the collector current in the transistor increases, thereby allowing the laser current to decrease and return the output power to its set value.

According to one aspect of the invention, a semiconductor device comprises a substrate having monolithically formed thereon with a common semiconductor layer structure a transverse junction laser within which is defined an optical cavity, and a heterojunction bipolar transistor, the optical cavity of the laser being axially aligned with a base region of the transistor such that optical output from the optical cavity impinges upon said base region, and means connected to said laser and said transistor for maintaining electrical communication therebetween such that optical output from said laser incident upon said base region causes a stabilizing feedback electrical signal to be generated by said transistor and which is communicated to said laser to thereby stabilize the optical output of said laser.

According to a second aspect of the invention, the base region of the transistor is internal to the optical cavity of the laser. Light is coupled from the lasing region into the transistor base across a narrow region of inactive semiconductor material.

According to a third aspect of the invention, the base region of the transistor is internal to the optical cavity of the laser. Light is coupled from the lasing region into the transistor base by an integrally formed, passive two dimensional optical waveguide.

According to a fourth aspect of the invention, the base region of the transistor is external to the optical cavity of the laser. Light is coupled from the laser cavity into the transistor base through a distributed grating reflector that functions as one mirror of the laser cavity.

According to a fifth aspect of the invention, the base region of the transistor is external to the optical cavity of the laser. Light is coupled from the laser cavity into the transistor base across a narrow groove etched in the semiconductor layers.

Each of the above aspects can be utilized to form an array of integrated laser/transistor structures in a single set of semiconductor layers on a single substrate. The output power from each integrated structure in this monolithic array is separately controlled by its independent data signal and simultaneously stabilized against unpredictable variations by the integrated feedback control provided by the phototransistor. Such integrated control is advantageous because it requires no high speed connections to the chip and because it coaxially integrates the transistor with the laser, thereby allowing the light emitting regions to be closely spaced.

The present invention may be embodied in a ROS apparatus which includes, inter alia, a light-emitting source, preferably an output-stabilized solid state laser, means for pulse modulating the light beam in accordance with a data signal, means for scanning the light beam in a raster fashion, and image plane means, such as a photoreceptive element, for receiving the scanned light beam.

In operation, a light beam is generated by the light source which is modulated in response to an image data signal. The light beam is scanned across at least a portion of a surface of the image plane means in a fast scan direction, as well as scanned across at least a portion of a surface of the image plane means in a slow scan direction which is normal to the fast scan direction. During the scanning, the image data signal modulates the light beam on and off to form distinct or overlapping spots of exposure on the surface of the image plane. The energy used to form each spot can be accurately controlled by the duration of the optical pulse because the pulse amplitude is stabilized against unpredictable variations. The pulse amplitude may be held fixed from spot to spot so that spots of constant size are formed on the surface of the image plane or may be changed from spot to spot so that spot size on the surface of the image plane varies in a desired way.

The control of optical energy provided by the present invention makes the areal size and/or illumination level of the exposure on the image plane independent of unknown or unpredictable variations in the amplitude of the optical power emitted by the optical source. Such independence is especially important in multiple beam ROS employing a monolithic optical source composed of closely spaced emitters, where the modulation of one emitter induces an unpredictable variation of power emitted by the other source.

Other objects and attainments together with a fuller understanding of the invention will become apparent and appreciated by referring to the following description and claims taken in conjunction with the accompanying drawings.

BRIEF DESCRIPTION OF THE DRAWINGS

In general, like reference numerals will be used to denote like elements as between each of the aforementioned figures.

DETAILED DESCRIPTION

Figure 1:
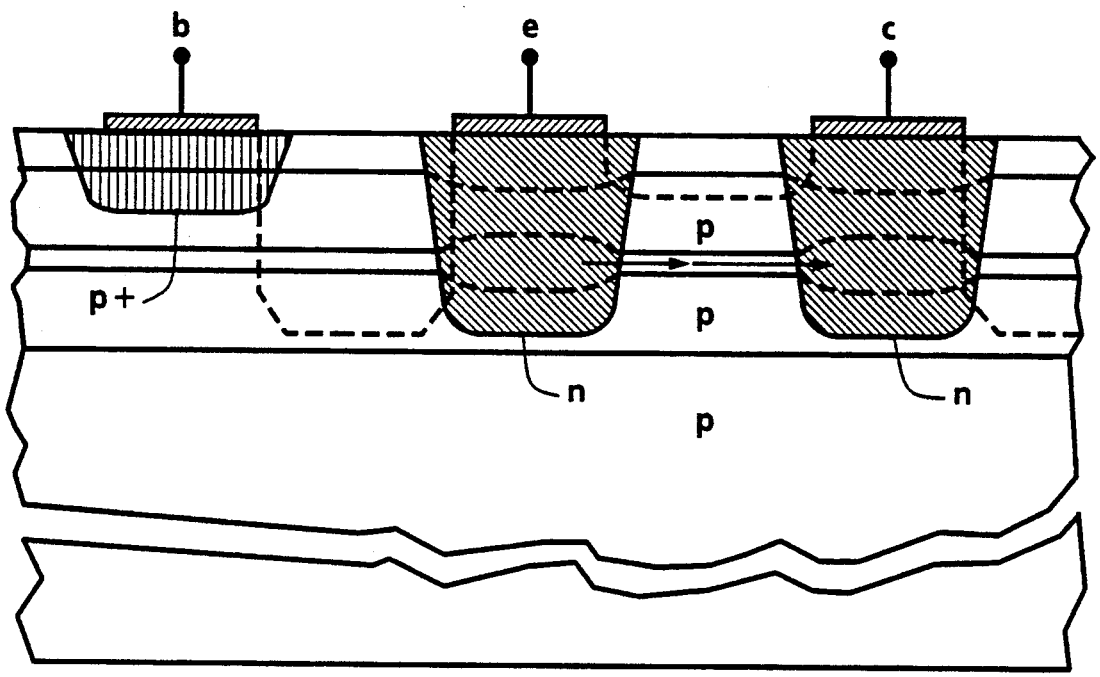
FIG. 1 shows a side or elevation view of a lateral heterojunction bipolar transistor of the prior art.
Figure 2:
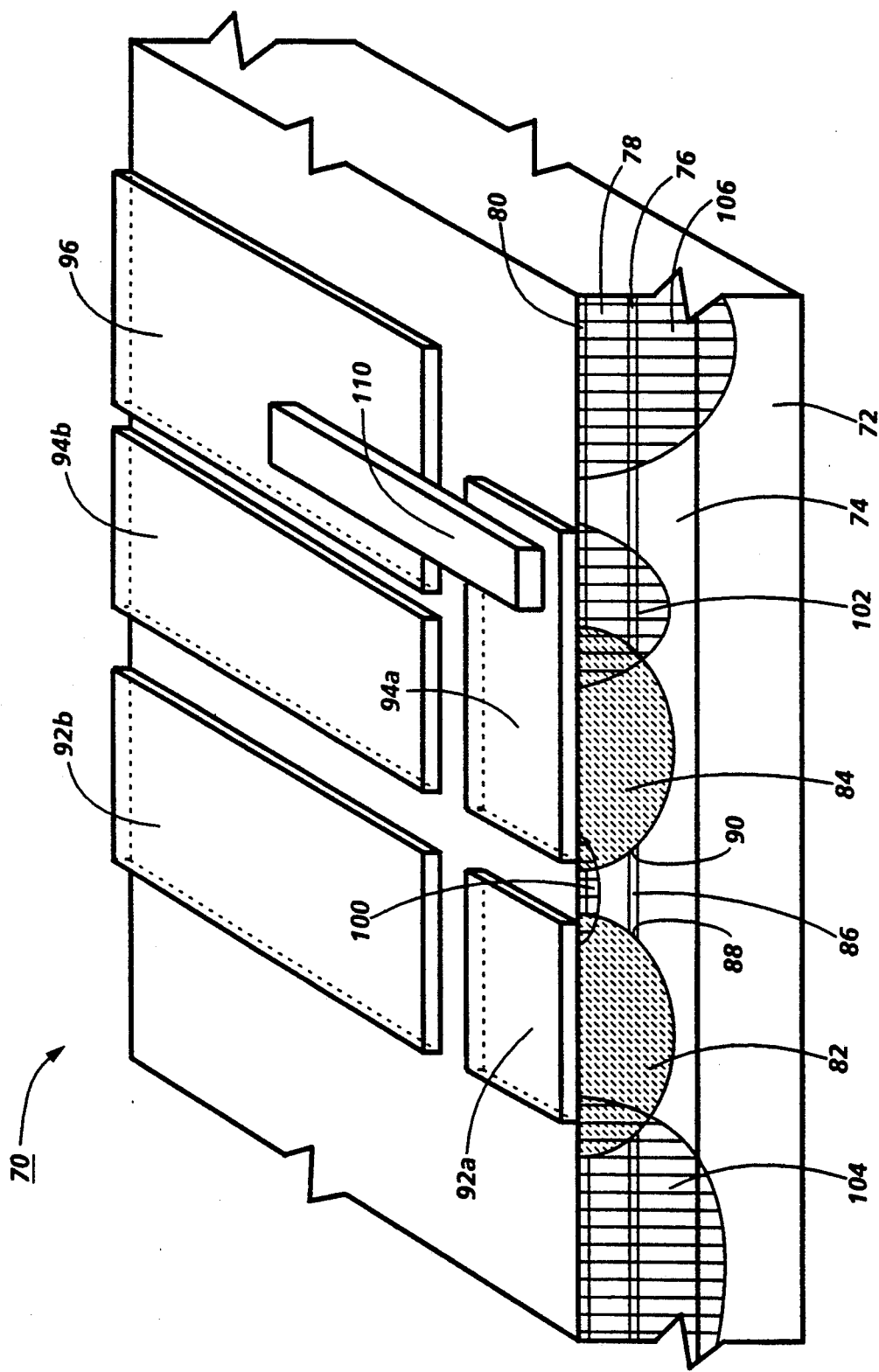
FIG. 2 shows a side or elevation view of a one embodiment of the integrated transistor/laser structure of this invention with light coupled through an inactive region of semiconductor layers.

Reference is now made to FIG. 2, wherein there is shown a first embodiment of this invention comprising an optically integrated transistor/laser structure 70. Device 70 comprises a semiconductor support 72 which is a semi-insulating substrate or support layer that blocks electrical connection between conducting regions of the integrated structure. Epitaxially deposited on support 72 are at least three semiconductor layers 74, 76, 78 wherein layers 74 and 78 are of wider bandgap material than semiconductor layer 76. Also semiconductor layers 74, 76, 78 are formed of the same conductivity type, shown here for example as p-type. As an example support 72 may be a substrate of semi-insulating GaAs, layer 74 may be p-$Ga_{1-x}Al_xAs$, layer 76 may be p-GaAs or p-$Ga_{1-y}Al_yAs$ and layer 38 may be p-$Ga_{1-z}Al_zAs$ where $x \simeq z > y$. The structure is completed with cap or ohmic contact layer 80 which may be p-GaAs.

The integrated structure has charge carrier regions with wide bandgap formed by impurity enhanced layer interdiffusion, most commonly known as impurity induced disordering (IID). The IID technique is disclosed, for example in U.S. Pat. No. 4,639,275 to Holonyak, Jr., as well as in many other references in the art. As shown in FIG. 2, the selectively disordered regions 82 and 84 cause at least a partial disordering or interdiffusion of the compound semiconductor materials comprising layers 74–80 within those regions. In particular, layer 76 in regions 82 and 84 is converted into a wide bandgap alloy of materials comprising material from layers 74, 76, and 78, e.g. $Ga_{1-A}Al_AAs$ where $A \approx z > y$. Also if the disordering is accomplished with an n-type impurity, such as Si, regions 82 and 84 will be of n-type conductivity.

The undisordered portion 86 of layer 76 between disordered regions 82 and 84 comprises a narrow bandgap layer or channel, e.g. of p-GaAs, bounded by wider bandgap undisordered portions of layers 74 and 78. The disordered alloy regions 82 and 84 also form an optical waveguide with region 86 as its core, suitable for use as a diode laser. Further, p-n heterojunctions 88 and 90 are formed, respectively, between n-type region 82 and p-type region 86 and between n-type region 84 and p-type region 86. As an example, layer 76 and consequently region 86 after completion of the disordering process, may be a narrow bandgap layer of 100 nm thickness, or may be sufficiently thin to form a quantum well layer and exhibit quantum size effects, e.g. 6 to 10 nm thick, or may be a multiple quantum well or superlattice structure of alternating thin layers of GaAs and AlAs or GaAs and GaAlAs.

Contact to regions 82, 84, and 86 is accomplished by metallization electrodes 92a, 92b, 94a, 94b, and 96. A distinguishing feature of this invention is that the contacts to regions 82 and 84 are each divided into two electrically isolated sections, respectively, 92a/92b and 94a/94b. Electrodes 92a and 94a, respectively, contact one section of regions 82 and 84, which function respectively as the emitter and collector regions of an n-p-n transistor. In one embodiment of this invention, the base region of the transistor has no contact since the transistor is operated open base. Electrodes 92b and 94b, respectively, contact the other sections of regions 82 and 84, and are operated in parallel to form the cathode of the laser. In order to eliminate the effect of potentially competing heterojunctions in layer 76 and 80, proton implants are performed into regions 102, 104, and 106, to damage the crystal lattice thereby rendering these regions of high resistance. Proton implant regions 104 and 106 are also formed deep enough to isolate different devices on the same chip. A shallow proton implant in region 100 deactivates the parasitic base layer formed by the GaAs capping layer 80 between disordered regions 82 and 84. The anode of the laser is provided by electrode 96 which contacts a path for current down through the p-layers into layer 74 and under the proton bombarded region 102. The ohmic contact to the base under electrode 96 may be facilitated with a Zn diffusion into cap layer 80 (not shown in FIG. 2).

Another distinguishing feature of this invention is that the optical waveguide formed by disordered regions 82 and 84 comprises the amplifying region of the laser structure and the base region of the transistor. The amplifying region of the laser is formed between the portion of region 82 contacted by electrode 92b and the portion of region 84 contacted by electrode 94b. The base region of the transistor is formed between the portion of region 82 contacted by electrode 92a and the portion of region 84 contacted by electrode 94b. Thus the base region 86 of the transistor is an integral part of the laser resonator, such that optical power generated in the amplifying region is optically coupled to and guided by the transistor base. In the embodiment of FIG. 2, coupling between the amplifying region and transistor base is provided by the undisturbed waveguide formed between regions 82 and 84.

Optical power is absorbed in base region 86 to create electron-hole pairs. The electrons diffuse to and are collected by the reverse-biased collector junction 90, leaving excess holes in the p-type base that lower the forward-biased potential on the emitter-base junction 88, causing additional electrons to be injected and consequently an increased collector current. The transistor then operates as a phototransistor with a base current that is directly proportional to the instantaneous value of the laser's internal optical power and amplified by normal transistor action.

Figure 3:
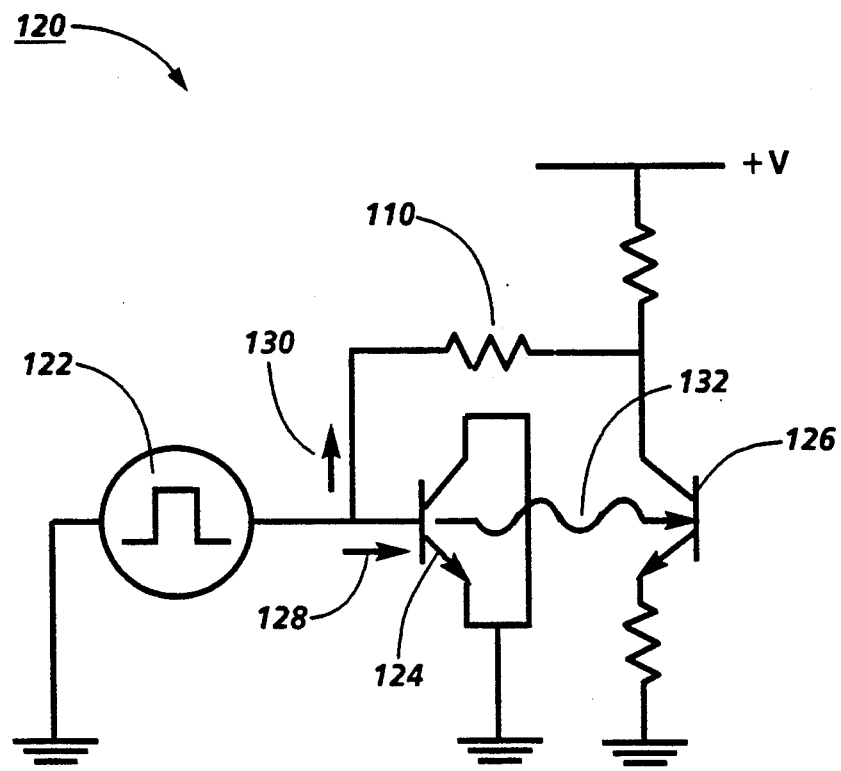
FIG. 3 shows the electrical circuit for the embodiment of this invention shown in FIG. 2.

The collector electrode of the transistor is connected to the anode of the laser via resistor 110 in order to form an automatic feedback control for the optical power output. For example, FIG. 3 shows electrical circuit 120 for providing automatic feedback control of the laser power output during pulse modulation. Pulsed current is supplied to laser 124 by laser driver 122, thereby turning on the laser to emit the desired optical power. The total current supplied by driver 122 to integrated structure 70 comprises current 128 supplied to laser 124 plus current 130 supplied to transistor 126. Laser 124 is optically coupled to transistor 126 by optical power 132. Consequently, if the power output of the laser changes with time, for example due to an increase in the ambient temperature or self-heating from the current pulse itself, electrical feedback from the transistor adjusts the portion of the driver current delivered to the laser, thereby maintaining a constant level of output power. For example, if the power output decreases from its set value, the collector current 130 in the transistor decreases, thereby allowing the laser current to increase and return the output power to its set value. Alternatively, if the power output increases from its set value, the collector current 130 in the transistor increases, thereby decreasing the laser portion 128 of the driver current to return the output power to its set value. Other feedback arrangements are also possible, as will be appreciated by one skilled in the art.

Figure 4:
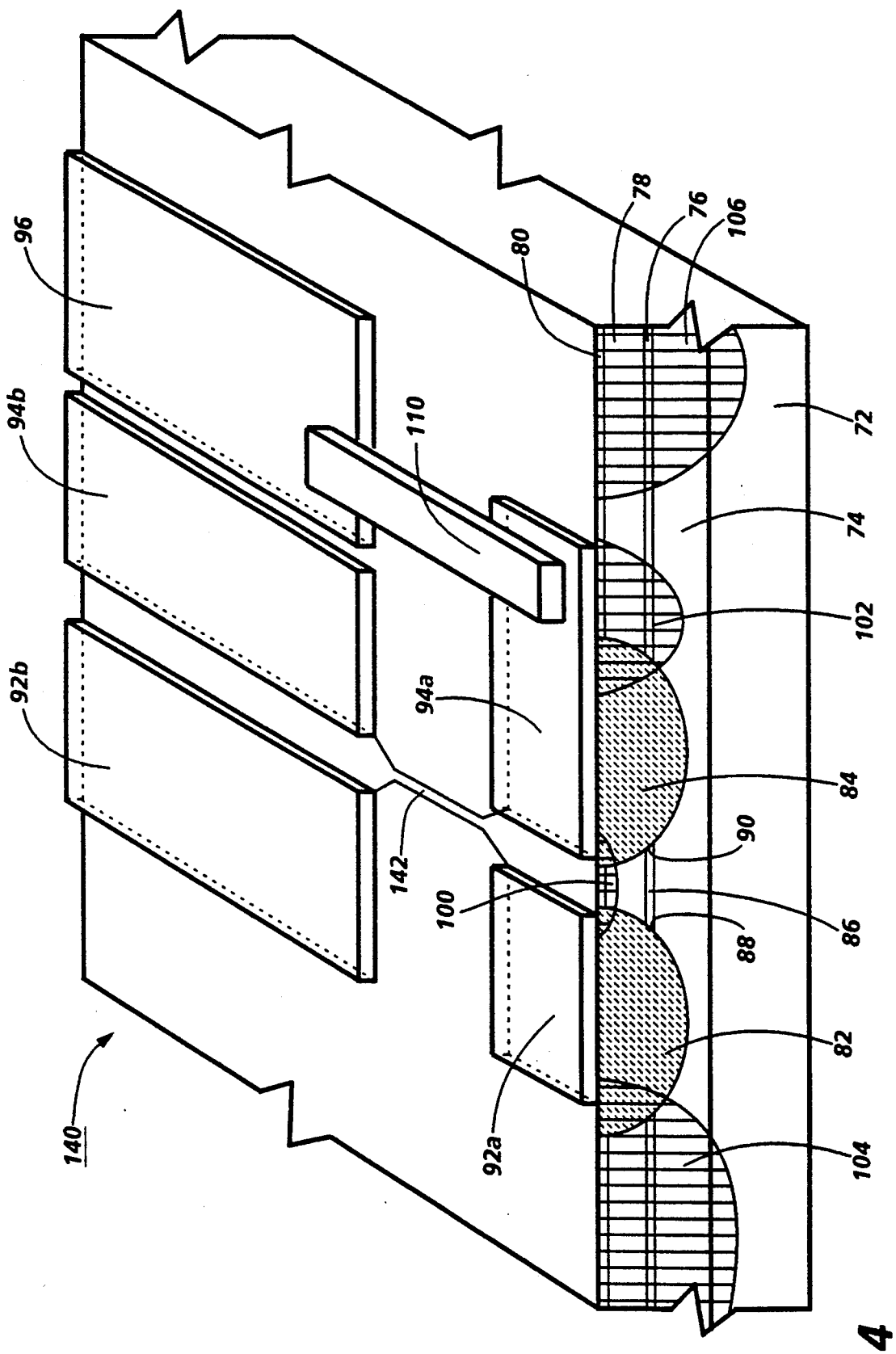
FIG. 4 shows a side or elevation view of another embodiment of the integrated transistor/laser structure of this invention with light coupled through a passive two-dimensional optical waveguide.

FIG. 4 shows a second embodiment 140 of this invention, wherein the phototransistor is optically coupled to the lasing region by a narrow, low loss waveguide 142 formed by impurity-induced disordering as disclosed in U.S. Pat. No. 4,802,182 to Thornton et al. and hereby incorporated by reference. Other parts of integrated structure 140 are substantially identical to the parts in integrated structure 70 of FIG. 2 and, therefore carry identical numerical identification. Utilization of the low loss waveguide is advantageous because it allows the separation between the lasing section of the structure, excited between electrodes 92b and 94b, and the transistor section of the structure, activated between electrodes 92a and 94a, to be increased compared to integrated structure 70, thereby increasing the electrical isolation between the phototransistor and the laser sections. For example, proton implants can be made between electrodes 92a and 92b and between 94a and 94b, thereby rendering these regions of high resistance.

Figure 5:
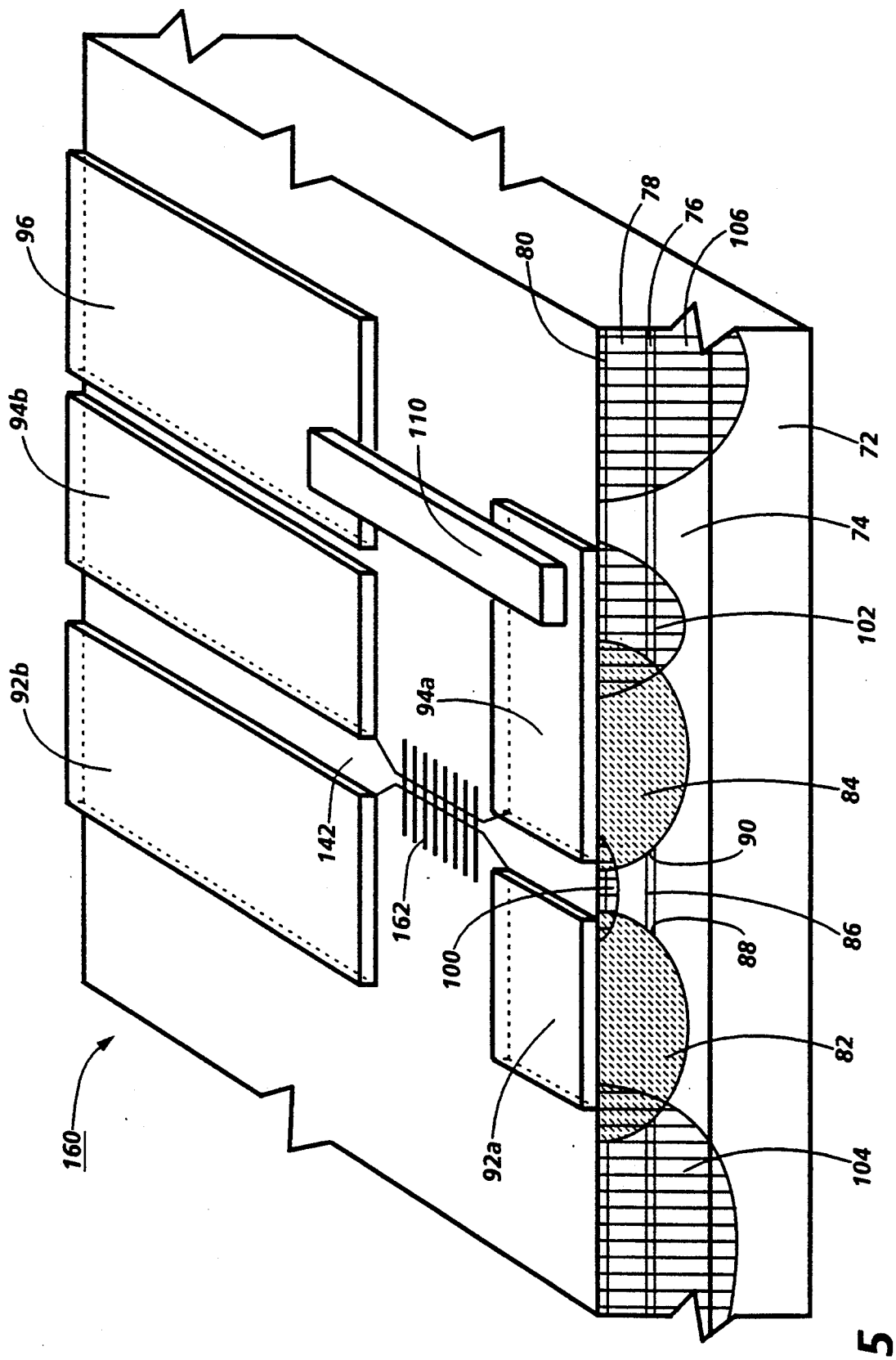
FIG. 5 shows a side or elevation view of yet another embodiment of the integrated transistor/laser structure of this invention where the transistor is separate from the laser by a distributed grating reflector.
Figure 6:
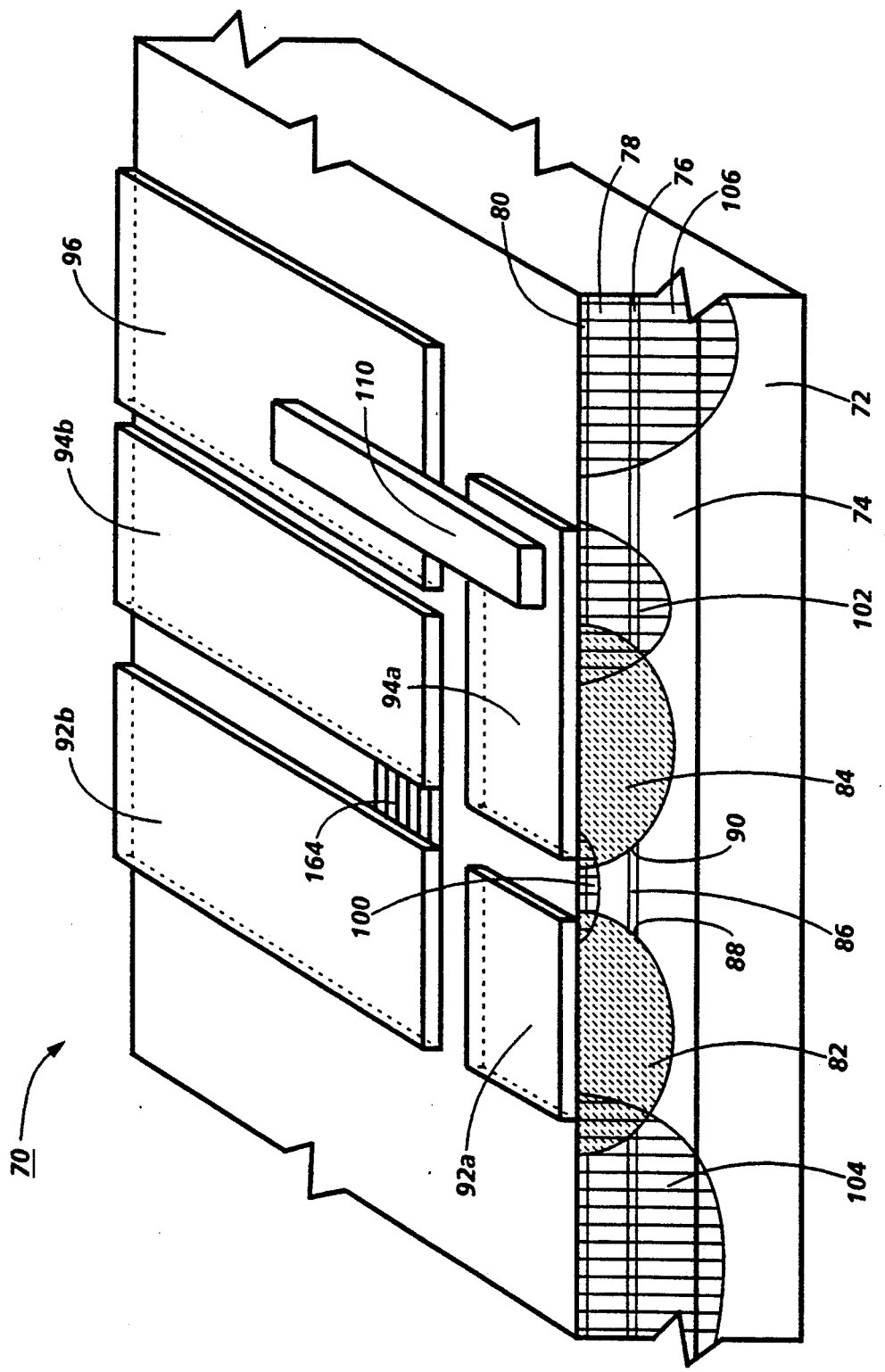
FIG. 6 shows a side or elevation view of still another embodiment of the integrated transistor/laser structure of this invention where the laser has formed therein a distributed grating reflector.

FIG. 5 shows a third embodiment 160 of this invention, wherein the phototransistor is optically coupled to the laser structure but is formed outside of the laser resonator. Integrated structure 160 is substantially identical to integrated structure 140 of FIG. 4 and, therefore like parts carry identical numerical identification. The distinguishing feature of structure 160 is that the transistor is separated from the laser by a short region of low loss waveguide 142 containing a distributed Bragg reflector 162. The optical waveguide can be formed, for example, by impurity induced layer disordering as disclosed in U.S. Pat. No. 4,802,182 to Thornton et al. The distributed Bragg reflector can be formed by providing a diffraction grating etched in the top cladding of the optical waveguide. The reflector provides enough reflectivity to establish one mirror of the laser cavity while coupling a portion of the light into the base of the phototransistor. FIG. 6 shows a variation of the embodiment shown in FIG. 5 in which a distributed Bragg reflector 164 is positioned not in a waveguide region, but in the active region of the laser nearest the transistor.

Figure 7:
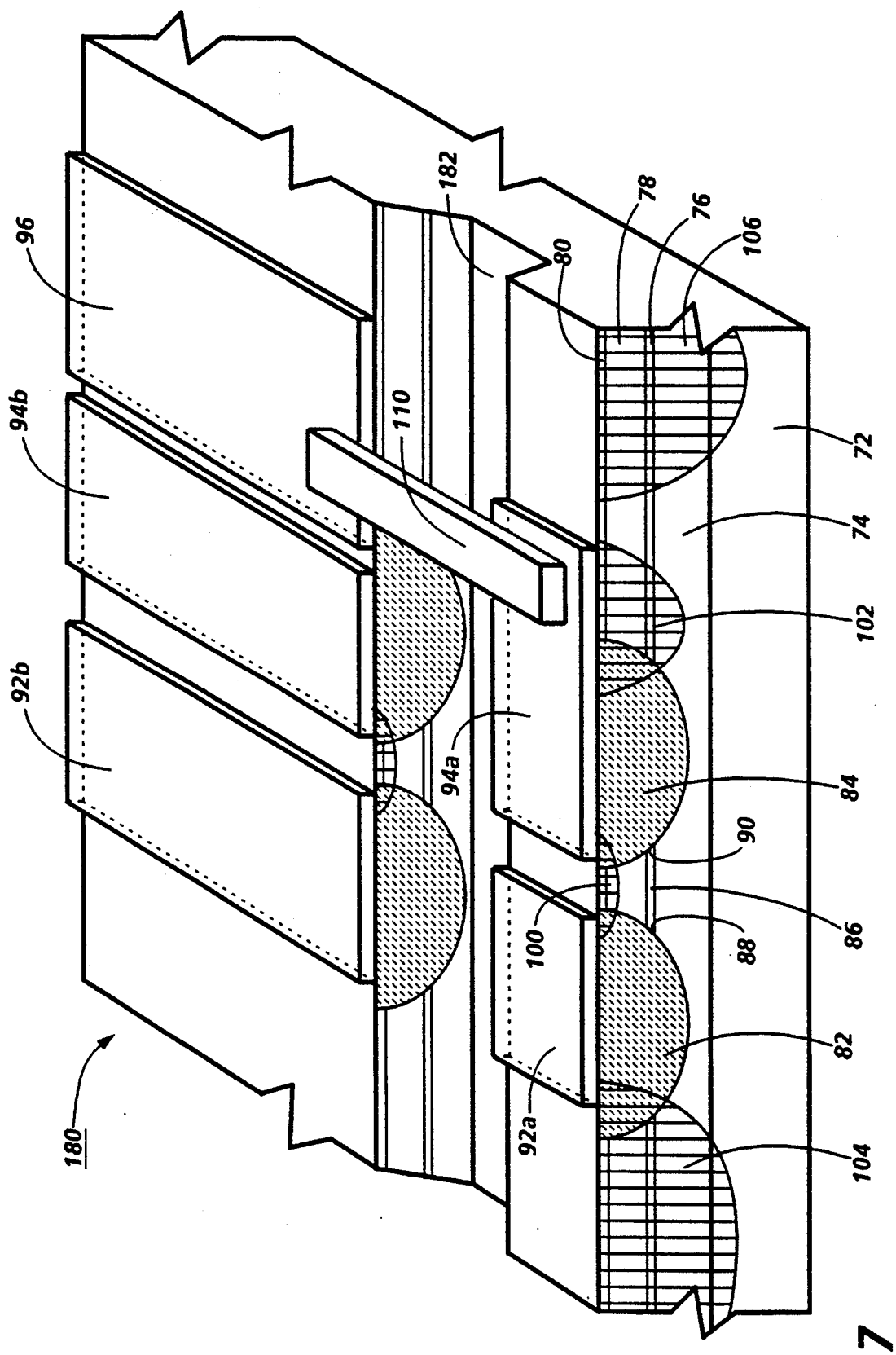
FIG. 7 shows a side or elevation view of yet another embodiment of the integrated transistor/laser structure of this invention where the transistor is separated from the optical cavity of the laser by a narrow etched groove.

FIG. 7 shows a fourth embodiment of this invention, wherein the phototransistor is optically coupled to the laser structure but is formed outside of the laser resonator. Integrated structure 180 is substantially identical to integrated structure 70 of FIG. 2 and, therefore like parts carry identical numerical identification. The distinguishing feature of structure 180 is that the transistor is separated from the laser by a narrow channel 182 etched between the laser electrodes 92b, 94b and the transistor electrodes 92a, 94a. As described by Bona, et al., in *Beam Properties of AlGaAs Power Lasers with High-Quality Etched Mirrors*, IEEE Photonics Technology Letters, vol. 3, pp. 412–413, (1991) chemically assisted ion-beam etching can be used to form a smooth, vertical surface on the laser side of the channel, thereby providing the mirror for the laser resonator. On the transistor side of the channel, the surface is formed at an angle to the axis of the waveguide in order to reduce reflection of light back into the laser.

The third and fourth embodiments of this invention are advantageous in that the phototransistor absorbs optical power emitted from the laser cavity, whereas in the first and second embodiments the phototransistor absorbs optical power within the laser cavity. Consequently, a phototransistor placed within the laser cavity increases the internal loss of the laser, thereby increasing the laser's threshold.

Each of the above embodiments can be utilized to form an array of integrated laser/transistor structures in a single set of semiconductor layers formed on a single substrate. The output power from each integrated structure in this monolithic array can be separately controlled by its independent data signal. Simultaneously with this modulation, the optical power emitted by each integrated laser structure is stabilized against unpredictable variations by the integrated feedback control provided by the phototransistor. This integrated control is advantageous because it requires no high speed connections to the chip and because it coaxially integrates the transistor with the laser, thereby allowing the light emitting regions to be closely spaced.

Figure 8:
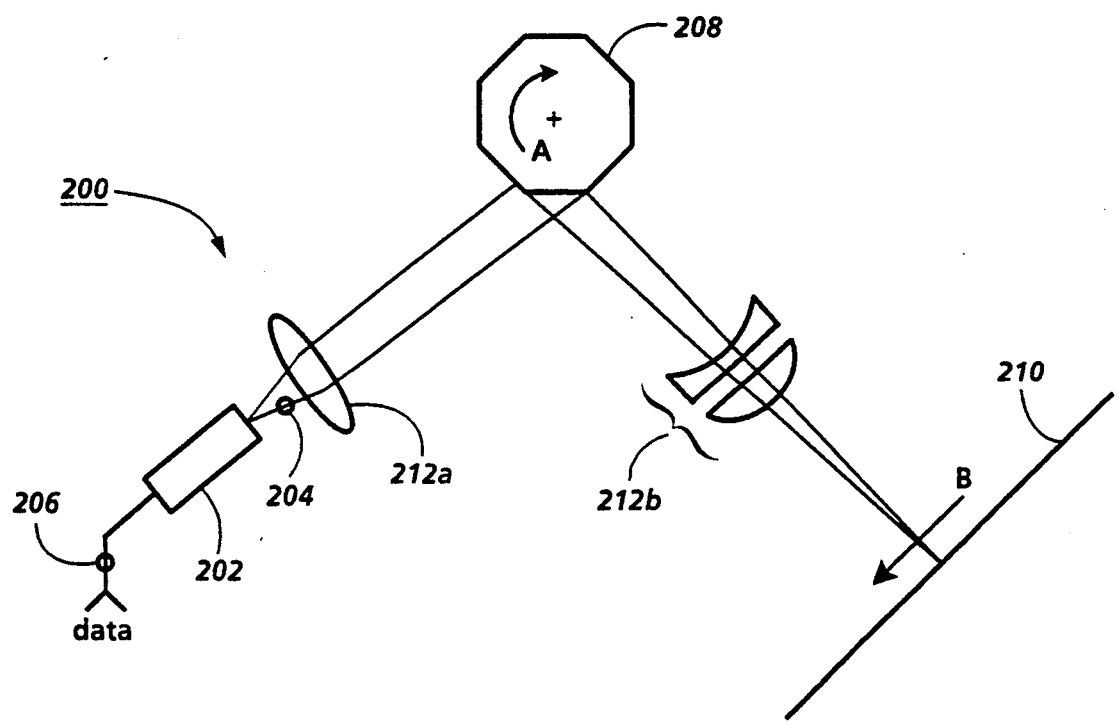
FIG. 8 shows a plan view of a basic ROS apparatus employing an integrated transistor/laser structure according to the present invention.

Finally, the present invention may be embodied in a ROS apparatus 200 as shown in FIG. 8 which includes, inter alia, an output-stabilized solid state laser source 202 (of single or multiple addressable spot output) for emitting at least one light beam 204, means 206 for pulse modulating the light beam in accordance with a data signal, means 208 for scanning the light beam in a raster fashion, image plane means 210, such as a photoreceptive element, for receiving the scanned light beam, and means 212a, 212b, for focusing the light onto the image plane means 210. The present invention finds particular advantage in such a ROS apparatus, as previously described.

In general, to those skilled in the art to which this invention relates, many changes in construction and widely differing embodiments and applications for the present invention will suggest themselves without departing from its spirit and scope. For example, while the above described structure is formed to have twin lateral p-n junctions (e.g., as shown by 88 and 90 of FIG. 2) between the anode and cathode of the laser, it is within the spirit and scope of the present invention that the laser may be formed to include only a single lateral p-n junction. Further, although impurity induced disordering techniques are described above with regard to formation of the laser/transistor structure, any other suitable technique maybe employed which results in the described structure or a structure equivalent thereto. Thus, the disclosures and descriptions herein are illustrative, and are not intended to be in any sense limiting.

What is claimed is:

1. A semiconductor device comprising:
   a substrate having monolithically formed thereon with a common semiconductor layer structure a transverse junction laser within which is defined an optical cavity, and a heterojunction bipolar transistor, the optical cavity of the laser being axially aligned with a base region of the transistor such that optical output from the optical cavity impinges upon said base region, and means connected to said laser and said transistor for maintaining electrical communication therebetween such that optical output from said laser incident upon said base region causes a stabilizing feedback electrical current to be generated by said transistor and which is communicated to said laser to thereby stabilize the optical output of said laser.

2. The semiconductor device of claim 1, wherein said optical cavity includes a distributed Bragg reflector located proximate said transistor.

3. The semiconductor device of claim 1, further comprising an optical waveguide disposed between and in optical communication with said optical cavity of said laser and said base region of said transistor.

4. The semiconductor device of claim 3, wherein said optical waveguide includes a distributed Bragg reflector.

5. The semiconductor device of claim 1, wherein said optical cavity of said laser and said base region of said transistor are a unitary, integrated structure.

6. In an array of independently addressable semiconductor laser light sources, an improved light source comprising:
   a substrate having monolithically formed thereon with a common semiconductor layer structure a transverse junction laser within which is defined an optical cavity, and a heterojunction bipolar transistor, the optical cavity of the laser being axially aligned with a base region of the transistor such that optical output from the optical cavity impinges upon said base region, and means connected to said laser and said transistor for maintaining electrical communication therebetween such that optical output from said laser incident upon said base region causes a stabilizing feedback electrical signal to be generated by said transistor and which is communicated to said laser to thereby stabilize the optical output of said laser.

7. The array of claim 6, wherein the improved light source further comprises an optical waveguide disposed between and in optical communication with said optical cavity of said laser and said base region of said transistor.

8. The array of claim 7, wherein in the improved light source said optical waveguide includes a distributed Bragg reflector.

9. The array of claim 6, wherein in the improved light source said optical cavity of said laser and said base region of said transistor are a unitary, integrated structure.

10. In a ROS apparatus of the type having an improved light source for emitting at least one light beam, means for pulse modulating the light beam in accordance with a data signal, means for scanning the light beam in a raster fashion, image plane means for receiving the scanned light beam, and means for focusing the light onto the image plane means, the improved light source comprising:

a substrate having monolithically formed thereon with a common semiconductor layer structure a transverse junction laser within which is defined an optical cavity, and a heterojunction bipolar transistor, the optical cavity of the laser being axially aligned with a base region of the transistor such that optical output from the optical cavity impinges upon said base region, and means connected to said laser and said transistor for maintaining electrical communication therebetween such that optical output from said laser incident upon said base region causes a stabilizing feedback electrical signal to be generated by said transistor and which is communicated to said laser to thereby stabilize the optical output of said laser.

11. The ROS apparatus of claim 10, wherein the improved light source further comprises an optical waveguide disposed between and in optical communication with said optical cavity of said laser and said base region of said transistor.

12. The ROS apparatus of claim 11, wherein in the improved light source said optical waveguide includes a distributed Bragg reflector.

13. The ROS apparatus of claim 10, wherein in the improved light source said optical cavity of said laser and said base region of said transistor are a unitary, integrated structure.

* * * * *